US006065978A

United States Patent [19]

Dehan et al.

[11] Patent Number: 6,065,978

[45] Date of Patent: May 23, 2000

[54] INPUT/OUTPUT CONNECTOR FOR PORTABLE COMMUNICATION DEVICE AND PROCESS FOR MOUNTING THE SAID CONNECTOR

[75] Inventors: Christophe F Dehan, Le Mans; Alain Gillet, Yvre-L'Eveque; Pascal Ribeau, Le Mans, all of France

[73] Assignee: Framatome Connectors International, Courbevoie, France

[21] Appl. No.: 09/058,377

[22] Filed: Apr. 9, 1998

[30] Foreign Application Priority Data

Apr. 11, 1997 [FR] France .................................. 97 04586

[51] Int. Cl.[7] .................................................. H05K 1/00

[52] U.S. Cl. .................................................. 439/79

[58] Field of Search .................................. 439/79, 59, 83, 439/81, 876

[56] References Cited

U.S. PATENT DOCUMENTS

| | | | |
|---|---|---|---|
| 5,133,670 | 7/1992 | Doi et al. | 439/79 |
| 5,201,664 | 4/1993 | Korsunsky et al. | 439/83 |
| 5,354,207 | 10/1994 | Chikano | 439/79 |
| 5,504,994 | 4/1996 | Banakis et al. | 29/884 |
| 5,547,384 | 8/1996 | Benjamin | 439/79 |
| 5,636,999 | 6/1997 | Hirai | 439/79 |
| 5,816,831 | 10/1998 | Clark | 439/79 |
| 5,855,484 | 1/1999 | Hennessey et al. | 439/79 |
| 5,876,221 | 3/1999 | Sasaki | 439/79 |

FOREIGN PATENT DOCUMENTS

WO 96/07221 3/1996 WIPO .

*Primary Examiner*—Steven L. Stephan
*Assistant Examiner*—Chandrika Prasad
*Attorney, Agent, or Firm*—Perman & Green, LLP

[57] ABSTRACT

An input/output connector for a portable communication device, wherein the input/output connector is to be surface mounted on a printed circuit board. The input/output connector comprises an insulating housing, contacts and means for shaping the contacts. The insulating housing has two positioning dogs fixed to lateral parts of the insulating housing. The two positioning dogs are to be soldered to the printed circuit board when the input/output connector is mounted thereto. The contacts are also to be soldered to the printed circuit board when the input/output connector is surfaced mounted to the printed circuit board. The means for shaping the contacts are received and mounted rigidly on a specified reference surface of the insulating housing. The means for shaping the contacts constrain and wedge the contacts relative to the reference surface of the insulating housing so that each of the contacts is contained in a common plane of reference for the coflatness of the contacts.

10 Claims, 3 Drawing Sheets

Figure 1:
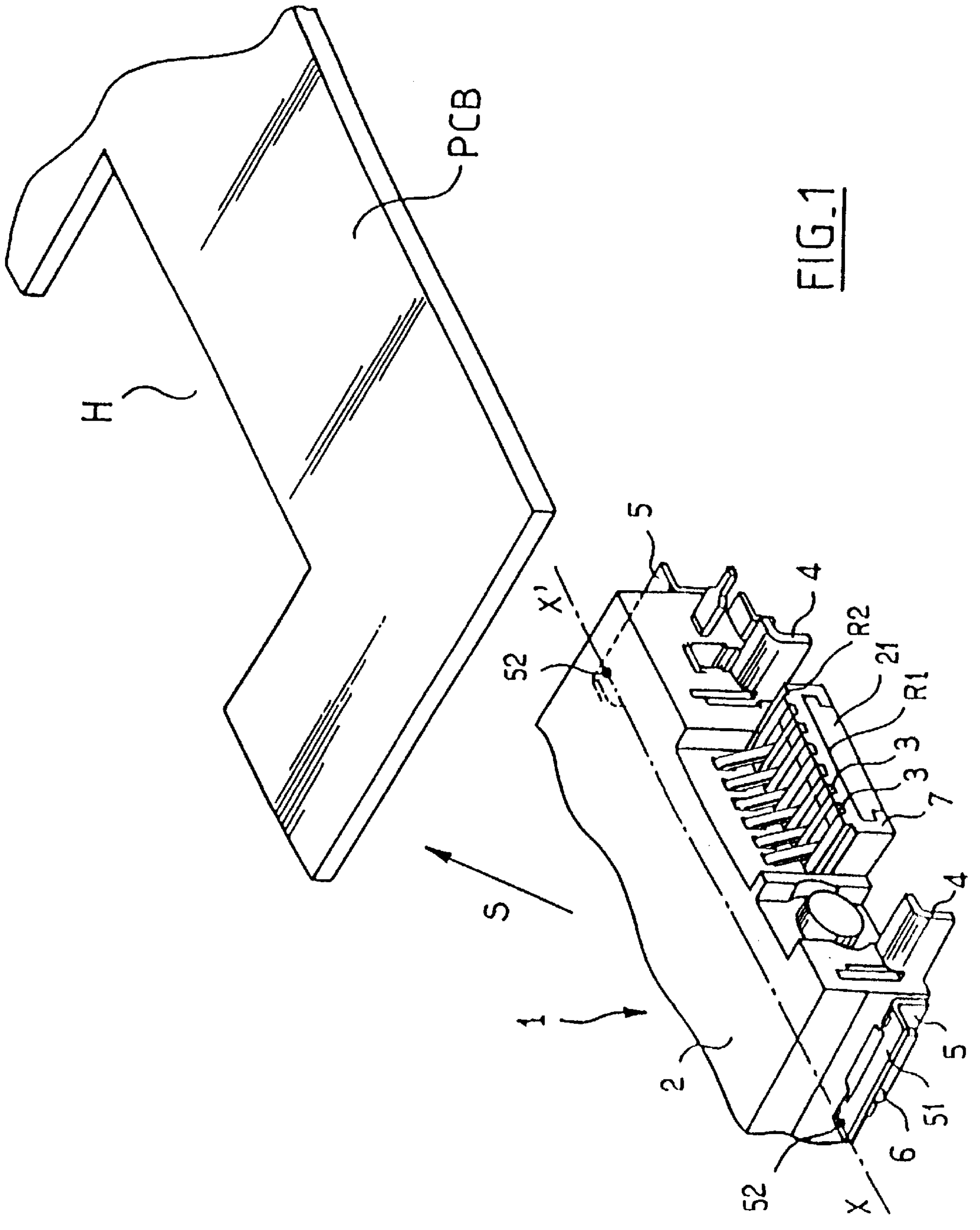

INPUT/OUTPUT CONNECTOR FOR PORTABLE COMMUNICATION DEVICE AND PROCESS FOR MOUNTING THE SAID CONNECTOR

The present invention relates to an input/output connector intended to be surface-mounted on a printed circuit board PCB comprising, among other things, an insulating housing on whose lateral parts are fixed, two positioning dogs to be soldered to the PCB, contacts to be soldered to the PCB. It also relates to the process for mounting the said connector.

In a general and known manner, the input/output connector of a portable communication device, for example a mobile telephone, which is of very small dimensions, is surface-mounted on a printed circuit board PCB. For the sake of conciseness and simplification the printed circuit board will hereafter be referred to as PCB ("Printed Circuit Board"), the term commonly used by those skilled in the art. This connector thus makes it possible to connect and disconnect an exterior electronic device, equipped with a complementary connector, to the portable communication device so as to permit dialogue between the two devices, or the testing of the functions or components installed on the PCB. Given the very small size of the connector used for this type of application and the vital need for highly accurate positioning during the mounting thereof so that the bearing plane of the connector coincides or at least almost coincides with the plane of the PCB, specific means for positioning and fixing the connector as well as the contacts must be provided. Thus, when implementing the product, the surface-mounting of the component, and also throughout the lifetime of the portable device, sometimes under severe handling conditions, all the contacts of the complementary connectors should be able to engage with one another and ensure that the contact pressure is adequate for good electrical transmission. Thus, it has been observed that for this function to be effective, it is necessary for the bearing plane of the connector to coincide or at least almost coincide with the plane of the PCB. In fact, this coplanarity provides for an efficient answer to a requirement for so-called coflatness, necessary for the implementation of the surface-mounting process, which requirement implies that any contact must be located within a maximum tolerance interval, which is desired to be small (for example of the order of 0.1 mm), in relation to the plane of bearing of the connector on the PCB, which bearing plane defines the plane of reference for the said coflatness.

International application WO 96/07221 describes such a connector which uses metal soldering fixings intended for holding it and setting it in position on the PCB. However, the use of such fixings has a considerable drawback since it does not allow the abovementioned necessary accuracy and hence the coflatness requirement to be met sufficiently rigorously. This is because the fixings described rest on the PCB over the whole of the surface of their base whilst, moreover, the connector rests at the rear on the said PCB either on a mounting surface or on a set of contacts. Thus, three surfaces which are independent and consequently whose probability of being coplanar is extremely small, the two surfaces of the bases of the fixings and the surface via which the rear of the connector rests on the PCB, are in this case involved in determining the plane of bearing of the connector on the PCB. Moreover, the dimensional constraints of the product do not allow sufficiently accurate guiding of the contacts. All of the above implies that this bearing plane evidently cannot be determined in an accurate and reproducible manner and yet, as was stated earlier, this bearing plane defines the plane of reference for the coflatness of the contacts and thus a considerable scatter is created as regards the coflatness.

In this context, the object of the present invention is efficiently to overcome this considerable drawback exhibited by the prior art and proposes an input/output connector whose design makes it possible to guarantee that the contacts, during mounting on the PCB, will all lie accurately and reproducibly at least in a predetermined tolerance interval, the maximum tolerance interval, and that the coflatness requirement can thus be satisfied rigorously.

To do this, the input/output connector mentioned in the preamble is noteworthy in that it comprises, received on a specified reference surface of its insulating housing, means for shaping the contacts intended to constrain and wedge the said contacts, in relation to the said reference surface of the insulating housing, in such a way that, thus constrained, each of the contacts is in a position such that it is contained in a plane of reference for the coflatness of the said contacts.

In a subsidiary manner, the input/output connector comprises, received on a specified reference surface of its insulating housing, means for shaping the contacts intended to constrain and wedge the said contacts, in relation to the said reference surface of the insulating housing, in such a way that, thus constrained, each of the contacts is in a position such that it lies in a predetermined tolerance interval with respect to a plane of reference for the coflatness of the said contacts.

In a preferred manner, the means for shaping the contacts consist of a shaping wedge mounted rigidly on the reference surface which is situated on the rear part of the insulating housing, the surface of the wedge pressing on the contacts for their shaping itself constituting a second reference surface in relation to the reference surface of the insulating housing, the contacts then bearing by elastic deformation on this second reference surface, thus being set in position and held by pressing.

Preferably, the wedge for shaping the contacts is mounted on the rear part of the insulating housing according to a jointing of the mortise and tenon type, the tenon consisting of the rear part of the insulating housing and the mortise consisting of the shaping wedge.

In a likewise noteworthy manner, according to the present invention, there is provided a process for mounting the input/output connector, in the course of which, in a first step, the shaping wedge is mounted rigidly on the reference surface which is situated on the rear part of the insulating housing according to a joining of the mortise and tenon type, the contacts being thus set in position and constrained, while in a second step the connector is presented so as to be jammed into a housing of the PCB provided for this purpose, while the assembly thus pressed together is surface-mounted on the PCB in the exact desired plane.

Thus, the invention consists advantageously in designing a connector provided with shaping means arranged on the insulating housing which, once the wedge has been inserted and while the connector is being placed on the PCB, will make it possible to keep the contacts pressing on the said shaping means in a position such that, at this precise moment, each of the said contacts is contained in a plane of reference for the coflatness of the signal contacts, or at the worst, subsidiarily, lies in the predetermined maximum tolerance interval with respect to the said plane of reference. Indeed, since the uncertainty as to the mutual coflatness of the contacts is related to their straightness and to their thickness tolerance, it is then easy to comply with the said requirement between contacts. Since the shaping means are mounted rigidly on a reference surface of the insulating housing, the contacts which are elastically deformed by bearing on a second reference surface which depends on the first are therefore shaped in relation to the reference surface of the insulating housing. The contacts are moreover redirected, this signifying that the contacts are then in an ideal position in terms of direction and height, in a reference frame specific to the insulating housing, in a stable manner in accordance with the coflatness requirement. This technique is accurate, efficient and reproducible and the coflatness requirement is thus guaranteed to be complied with in full. Moreover, by virtue of the shaping means claimed herein, which make it possible to hold the contacts constrained in the desired position, an operation of cementing the said contacts may be regarded as superfluous and may thus be dispensed with, this constituting another considerable advantage.

The following description, in conjunction with the appended drawings, the whole given by way of non-limiting example, will elucidate the manner in which the invention may be practised.

FIG. 1 represents the connector according to the invention in perspective before it is mounted on the PCB.

Figure 2A:
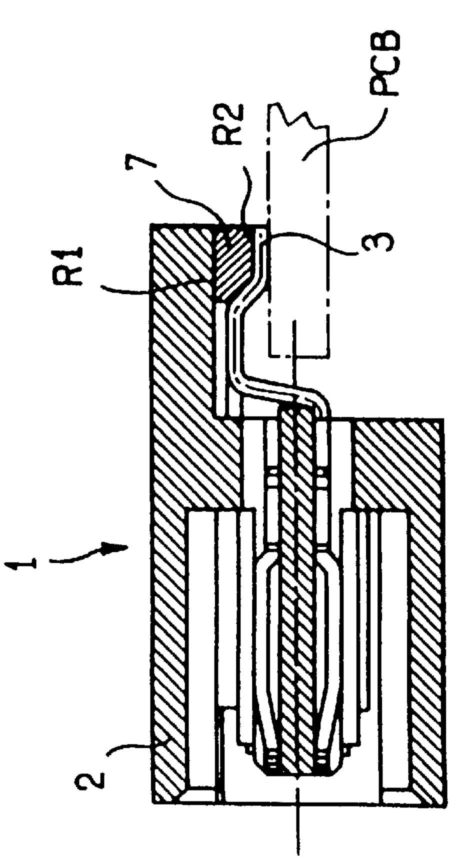
Figure 2B:
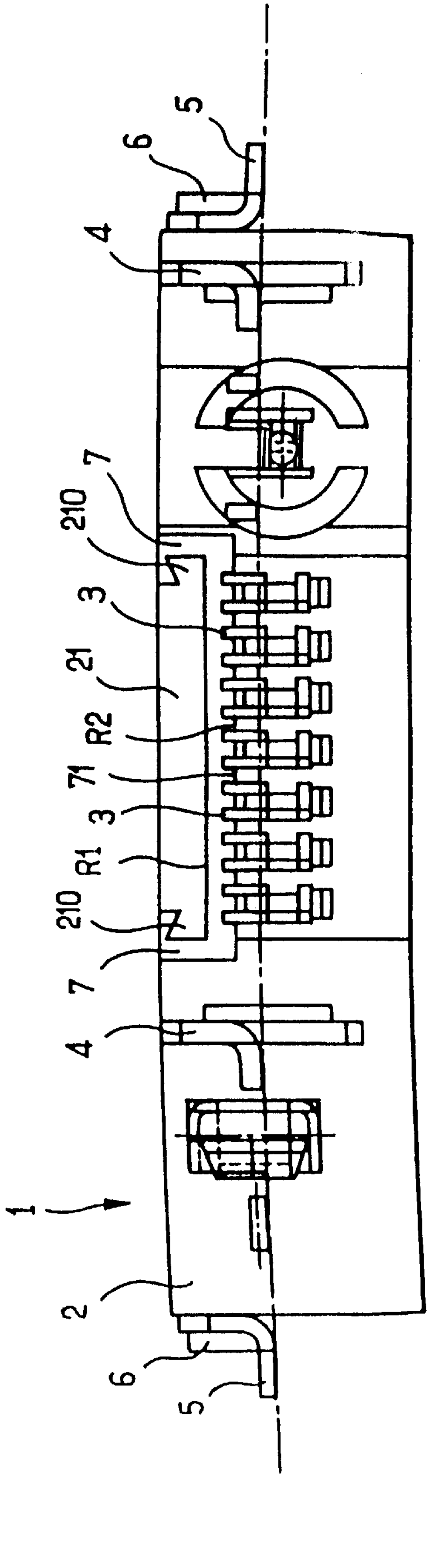

FIG. 2*a* shows in section a side view of the connector according to the invention after it is mounted on the PCB whereas FIG. 2*b* shows a front view of the said connector.

Figure 3A:
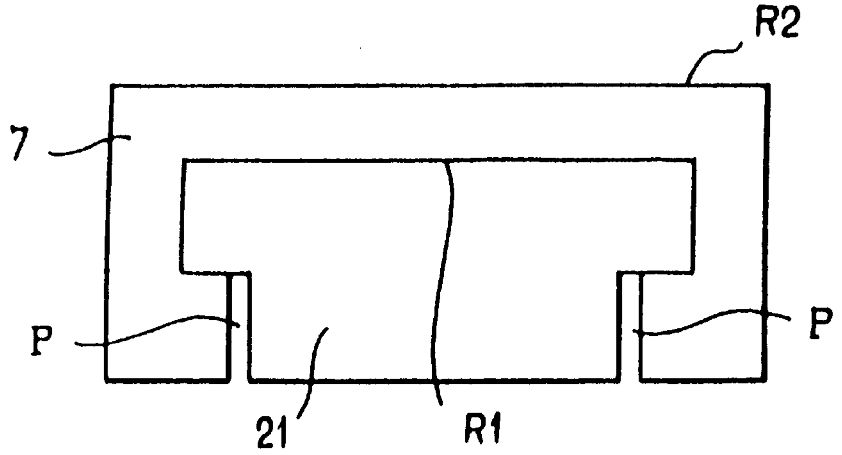
Figure 3B:
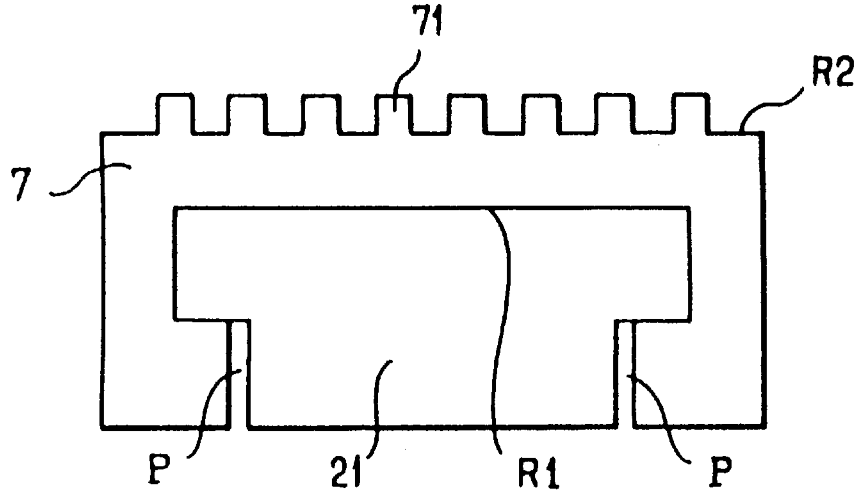
Figure 3C:
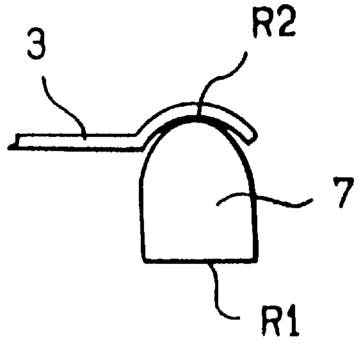

FIGS. 3*a*, 3*b* and 3*c* represent three embodiments of the shaping wedge of the connector according to the invention.

FIGS. 1, 2*a* and 2*b* will be utilized simultaneously for a proper understanding of the characteristics of the connector in accordance with the invention. Represented in perspective in FIG. 1 is a connector 1 intended to be surface-mounted, that is to say to be soldered according to the "surface-mounted components" (termed SMC by those skilled in the art) technology, on a printed circuit board PCB which comprises a housing H to which the connector 1 is presented (the arrow labelled S in FIG. 1 specifies the direction of placement) and then jammed fast. The connector 1 consists chiefly of an insulating body 2, it comprises a set of contacts 3, a pair of interlocks 4 intended to be soldered to the PCB as well as a pair of positioning dogs 5 likewise intended to be soldered to the PCB to hold the connector in position on the said PCB. Preferably, the positioning dogs 5 are mounted in a removable manner on the body 2 which, in order to receive them, has on its two side walls two lugs 6 in the shape of an inverted L and under which each positioning dog 5 is slid and immobilized. Each positioning dog 5 can comprise, on its flat part 51 intended to come into contact with the PCB and located towards its end situated furthest outboard of the PCB, a projection or boss 52 of small height designed to form a point contact with that part of the PCB intended to receive it. The two points of contact of the two projections 52 therefore mathematically determine a straight line support for an axis of rotation XX' of the connector allowing it, while it is being mounted, to swing in such a way that the contacts 3 are brought close in turn to corresponding contact pads of the PCB (which are not shown in the drawing). This projection 52 and its characteristics are disclosed in detail in a French Patent Application filed on the same date by the same applicant, this Patent Application being incorporated herein by way of reference. In accordance with the invention the input/output connector 1 is noteworthy in that it comprises, received on a specified reference surface R1 of its insulating housing 2, means 7 for shaping the contacts 3 intended to constrain and wedge the said contacts, in relation to the said reference surface R1 of the insulating housing, in such a way that, thus constrained, each of the said contacts is in a position such that it is either contained in a plane of reference for the coflatness of the said contacts, or lies in a predetermined tolerance interval with respect to the said plane of reference.

Preferably, the means for shaping the contacts 3 consist of a compression member or shaping wedge 7 mounted rigidly on the reference surface R1 which is situated on the front part 21 of the insulating housing 2, the surface of the wedge 7 pressing on the contacts 3 for their shaping itself constituting a second reference surface R2 in relation to the reference surface R1 of the insulating housing 2, the contacts 3 then bearing by elastic deformation on this second reference surface R2, thus being set in position and held by pressing. As seen best in FIGS. 2*a*–2*b*, the reference surface R1 of the insulating housing 2 is disposed over the contacts 3, and the shaping wedge 7 is compressed between the reference surface R1 of the housing and the contacts 3 of the connector.

In a preferred manner, and as is shown in FIGS. 1 and 2*b*, the wedge 7 for shaping the contacts 3 is mounted on the rear part of the insulating housing 2 according to a jointing of the mortise and tenon type, the tenon consisting of the front part of the insulating housing 21 and the mortise consisting of the shaping wedge 7. According to two non-limiting embodiments, in FIG. 1 the tenon 21 has the shape of a T while in FIG. 2 the tenon 21 comprises two half-dovetails 210 situated on its two lateral parts.

In a non-exhaustive manner, three preferred embodiments of the shaping means 7 will be described with the aid of FIGS. 3*a*, 3*b* and 3*c*. FIGS. 3*a* and 3*b* are front views of the connector represented, for the sake of simplification, in a highly schematic manner, while FIG. 3*c* is a partial side view of a contact shaped over a shaping wedge of curved profile. FIG. 3*a* therefore depicts a first embodiment of the shaping means 7. In this first embodiment, the surface of the shaping wedge 7 pressing on the contacts 3, (which are not represented) itself constitutes, in relation to the reference surface R1 of the insulating housing 2, a second reference surface R2 which here is a plane surface.

In the second embodiment of the shaping means 7 depicted in FIG. 3*b*, the surface of the shaping wedge 7 pressing on the contacts 3 (which are not represented) has notches 71 (which can also be seen in FIG. 2*b*) at the bottom of which the contacts 3 are set in position and thus constrained, the second reference surface R2 then passing through the bottom of the notches 71. In this case the notches 71 also ensure a redirecting in parallelism of the rear parts of the contacts nearest the soldering region.

With the third embodiment of the shaping means 7, depicted in FIG. 3*c*, there is proposed a partial side view of a contact 3 shaped over a shaping wedge 7 of curved profile. Indeed, in this embodiment the surface of the shaping wedge 7 pressing on the contact 3 which itself constitutes a second reference surface R2 is a curved surface. Here, the contacts can only bear on part of the reference surface R2 and they are bowed accordingly.

It should be noted, as may be seen in FIGS. 3*a* and 3*b*, that in order to allow simple and accurate mounting, lateral play is provided on either side of the shaping wedge 7/insulating housing 2 joint. Thus, only the surfaces R1, R2 and the upper lateral surfaces of the mortise and tenon joint need to be determined accurately.

When surface-mounting the input/output connector according to the invention, the following process may advantageously be utilized. Thus, according to this easily implemented mounting process, in a first step, the shaping wedge 7 is mounted rigidly on the reference surface R1 which is situated on the front part 21 of the insulating housing 2 according to a jointing of the mortise and tenon type, the contacts 3 being thus set in position and constrained, while in a second step the connector 1 is presented so as to be jammed into the housing H of the PCB provided for this purpose, while the assembly thus pressed together is surface-mounted on the PCB in the exact desired plane.

This technique implemented in a non-limiting manner according to the various embodiments, whilst offering excellent reproducibility since it allows the contacts to be secured in their attachment region in a stable and accurate position whilst avoiding any relaxation of the said contacts, affords a simple and efficient solution to the problem posed by the requirement of coflatness. Moreover, as was stated earlier, such a technique using shaping means makes it possible, if so desired, to dispense with the operation of cementing the said contacts simply through the fact that it makes it possible to hold the constrained contacts in the desired position by altering their elasticity.

What is claimed is:

1. An input/output connector for a portable communication device, the connector being adapted to be surface mounted on a printed circuit broad (PCB) and comprising:

an insulating housing having a pair of positioning dogs connected to the housing for mounting the housing to the PCB;

contacts connected to the housing for contacting the PCB when the connector is mounted to the PCB; and means for shaping the contacts, the means for shaping the contacts being mounted on the housing and comprising a compression member disposed between a reference surface of the housing and the contacts;

wherein, when the connector is mounted to the PCB the compression member is compressed between the reference surface of the housing and the contacts, the compression member pressing the contacts against the PCB such that the contacts are substantially contained in a co-flatness plane of reference.

2. An input/output connector in accordance with claim 1, wherein the compression member biases the contacts against the PCB.

3. Input/output connector according to claim 1, wherein the compression member comprises a shaping wedge mounted on the reference surface which is situated on a front part of the insulating housing, the wedge having a surface pressing on the contacts for their shaping the wedge surface constituting a second reference surface in relation to the reference surface of the insulating housing, the contacts bearing by elastic deformation on this second reference surface when being set in position and held by pressing.

4. Input/output connector according to claim 3, characterized in that the wedge for shaping the contacts is mounted on the front part of the insulating housing according to a jointing of the mortise and tenon type, the tenon consisting of the front part of the insulating housing and the mortise consisting of the shaping wedge.

5. Input/output connector according to claim 3, characterized in that the surface of the shaping wedge pressing on the contacts for their shaping and itself constituting a second reference surface is a substantially plane surface.

6. Input/output connector according to claim 3, characterized in that the surface of the shaping wedge pressing on the contacts for their shaping comprises notches at a bottom of which the contacts are set in position and thus constrained, the second reference surface then passing through the bottom of the notches.

7. Input/output connector according to claim 3, characterized in that the surface of the shaping wedge pressing on the contacts for their shaping and itself constituting a second reference surface is a curved surface.

8. Process for mounting the input/output connector according to one of claim 3, characterized in that, in a first step, the shaping wedge is mounted on the reference surface which is situated on the front part of the insulating housing according to a jointing of the mortise and tenon type, the contacts being thus set in position and constrained, while in a second step the connector is presented so as to be jammed into a housing of the PCB provided for this purpose, while the assembly thus pressed together is surface-mounted on the PCB in the exact desired plane.

9. An input/output connector for a portable communication device, the connector being adapted to be surface mounted on a printed circuit broad (PCB) and comprising:

an insulating housing having a pair of positioning dogs connected to the housing for mounting the housing to the PCB;

contacts connected to the housing for contacting the PCB when the connector is mounted to the PCB; and means for shaping the contacts, the means for shaping the contacts being mounted on the housing, wherein the housing has a reference surface disposed over the contacts so that the contacts are located between the reference surface and the PCB, the means for shaping the contacts being located between the contacts and the reference surface over the contacts for wedging the contacts in a position in which the contacts lie substantially in a predetermined tolerance interval with respect to a co-flatness reference plane of the contacts.

10. A method for mounting an input/output connector on a printed circuit board (PCB), the method comprising the steps of:

providing the connector with an insulating housing having a reference surface disposed over contacts of the connector so that when the connector is mounted on the PCB the contacts are located between the reference surface of the housing and the PCB; and mounting a wedge on the reference surface of the insulating housing, the reference surface compressing the wedge against the contacts and urging the contacts against the PCB when the housing is mounted on the PCB.

* * * * *